(12) United States Patent
Eisert et al.

(10) Patent No.: US 8,598,604 B2
(45) Date of Patent: Dec. 3, 2013

(54) OPTOELECTRONIC COMPONENT

(75) Inventors: Dominik Eisert, Regensburg (DE);
Norbert Linder, Lappersdorf (DE);
Raimund Oberschmid, Sinzing (DE);
Dirk Berben, Taufkirchen (DE); **Frank
Jermann, Königsbrunn (DE); Martin
Zachau**, Geltendorf (DE)

(73) Assignee: Osram Opto Semiconductors GmbH,
Regensburg (DE)

( * ) Notice: Subject to any disclaimer, the term of this patent is extended or adjusted under 35 U.S.C. 154(b) by 835 days.

(21) Appl. No.: 12/088,250

(22) PCT Filed: Sep. 27, 2006

(86) PCT No.: PCT/DE2006/001701
§ 371 (c)(1),
(2), (4) Date: Feb. 13, 2009

(87) PCT Pub. No.: WO2007/036214
PCT Pub. Date: Apr. 5, 2007

(65) Prior Publication Data
US 2009/0261366 A1    Oct. 22, 2009

(30) Foreign Application Priority Data

Sep. 28, 2005  (DE) .......................... 10 2005 046 368
Dec. 27, 2005  (DE) .......................... 10 2005 062 514

(51) Int. Cl.
*H04N 9/31*        (2006.01)
(52) U.S. Cl.
USPC .... 257/89; 257/80; 257/E25.08; 257/E31.099
(58) Field of Classification Search
USPC ........................................................... 257/89
See application file for complete search history.

(56) References Cited

U.S. PATENT DOCUMENTS

| 5,684,309 A | 11/1997 | McIntosh et al. |
| 5,813,753 A | 9/1998 | Vriens et al. |

(Continued)

FOREIGN PATENT DOCUMENTS

| DE | 10142009 | 3/2003 |
| DE | 102 61 428 | 7/2004 |

(Continued)

OTHER PUBLICATIONS

"Translation of the Notification of Reasons for Refusal (type I office action)", Japanese Appl. No. 2008-532593, mailed on Aug. 17, 2011 (4 pages).

(Continued)

*Primary Examiner* — Fernando L Toledo
*Assistant Examiner* — Mohammad Choudhry
(74) *Attorney, Agent, or Firm* — Fish & Richardson P.C.

(57) ABSTRACT

An optoelectronic component with a semiconductor body that comprises an active semiconductor layer sequence is disclosed, which is suitable for generating electromagnetic radiation of a first wavelength that is emitted from a front face of the semiconductor body. The component also comprises a first wavelength conversion substance following the semiconductor body in its direction of emission, which converts radiation of the first wavelength into radiation of a second wavelength different from the first wavelength, and a first selectively reflecting layer between the active semiconductor layer sequence and the first wavelength conversion substance that selectively reflects radiation of the second wavelength and is transparent to radiation of the first wavelength.

39 Claims, 6 Drawing Sheets

(56) References Cited

U.S. PATENT DOCUMENTS

| | | | |
|---|---|---|---|
| 5,831,277 | A | 11/1998 | Razeghi |
| 6,111,272 | A | 8/2000 | Heinen |
| 6,155,699 | A | 12/2000 | Miller et al. |
| 6,172,382 | B1 | 1/2001 | Nagahama et al. |
| 6,188,093 | B1 | 2/2001 | Isogai et al. |
| 6,327,413 | B1 * | 12/2001 | Kinoshita ............ 385/129 |
| 2004/0061124 | A1 | 4/2004 | Trottier et al. |
| 2004/0079942 | A1 | 4/2004 | Steranka et al. |
| 2005/0184638 | A1 | 8/2005 | Mueller et al. |

FOREIGN PATENT DOCUMENTS

| | | |
|---|---|---|
| EP | 0905797 | 3/1999 |
| EP | 1 601 027 | 11/2005 |
| JP | 11145519 | 5/1999 |
| JP | 2000-515689 | 11/2000 |
| JP | 2001-501380 | 1/2001 |
| JP | 2004-119984 | 4/2004 |
| JP | 2004-153277 | 5/2004 |
| JP | 2005-244226 | 9/2005 |
| TW | 393777 | 6/2000 |
| TW | 506127 | 10/2002 |
| WO | WO 97/50132 | 12/1997 |
| WO | WO 98/54929 | 12/1998 |
| WO | WO 98/54930 | 12/1998 |
| WO | WO 01/24283 | 4/2001 |
| WO | WO 01/39282 | 5/2001 |
| WO | WO 02/13281 | 2/2002 |
| WO | WO 2004/068552 | 8/2004 |
| WO | WO 2004/068598 | 8/2004 |
| WO | WO 2005/100016 | 10/2005 |

OTHER PUBLICATIONS

I. Schnitzer et al., "30% external quantum efficiency from surface textured, thin-film light-emitting diodes", *Appl. Phys. Lett.*, vol. 63, No. 16, pp. 2174-2176 (Oct. 18, 1993).

International Search Report for PCT/DE2006/001701 dated Jan. 8, 2007.

"Notification for the Opinion of Examination," Taiwan Application No. 9513079, issued Feb. 2, 2010 (5 pages).

Young-Hoe, Gu, "Notice of Office Action", KR Application No. 10-2008-7010160, mailed on Sep. 13, 2012 (14 pages).

Examination Report for European Patent Application No. 06 791 402.8—1551 by Examiner J. van der Linden dated Sep. 16, 2013 (5 pages).

* cited by examiner

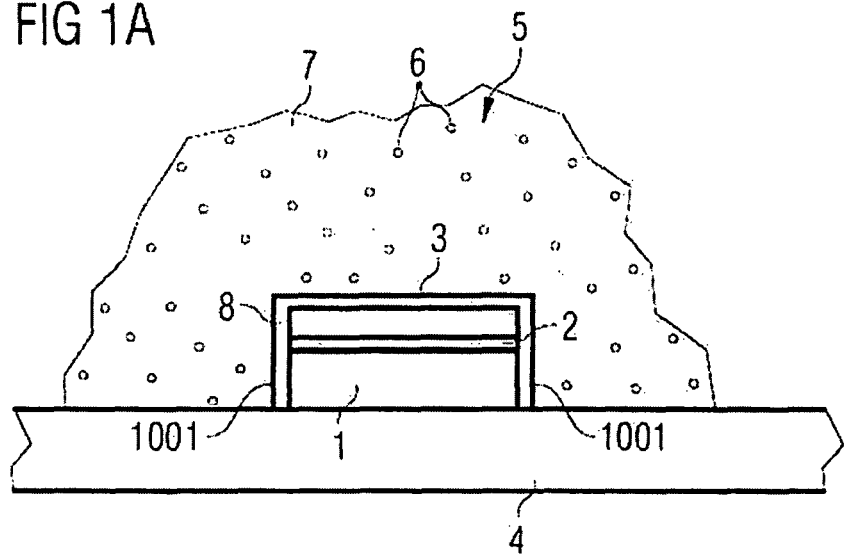
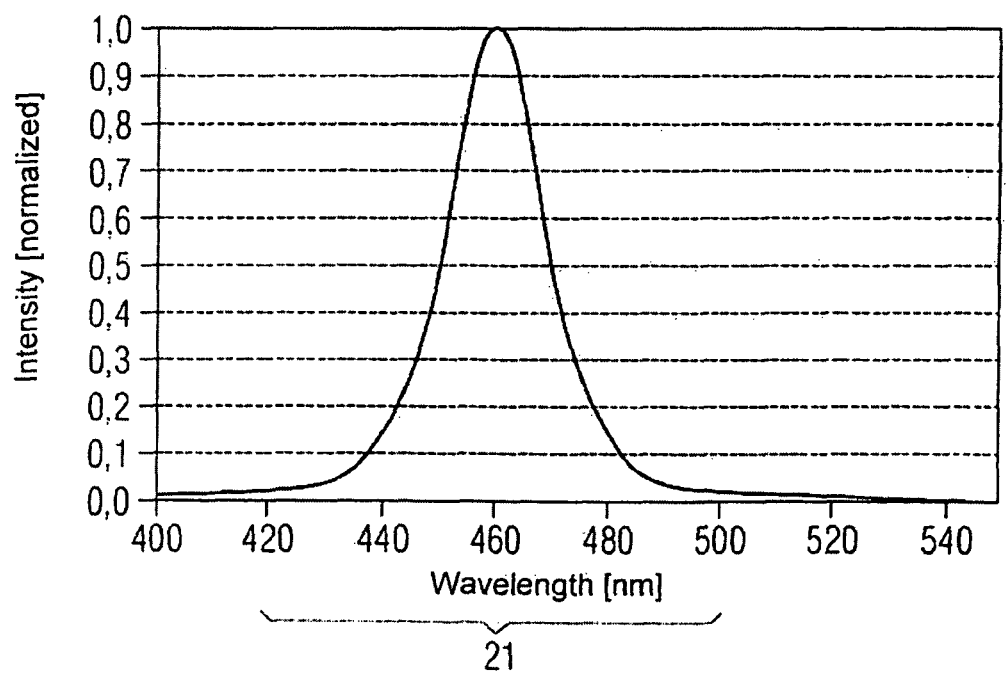

| Layer packet | Layer number | Material | Layer thickness [nm] | Index of refraction |
|---|---|---|---|---|
| 1 | 1 | TiO2 | 60,14 | 2,9 |
|  | 2 | SiO2 | 128,37 | 1,458 |
|  | 3 | TiO2 | 64,18 | 2,9 |
|  | 4 | SiO2 | 184,07 | 1,458 |
|  | 5 | TiO2 | 77,54 | 2,9 |
|  | 6 | SiO2 | 198,06 | 1,458 |
| 2 | 7 | TiO2 | 73,36 | 2,9 |
|  | 8 | SiO2 | 63,35 | 1,458 |
|  | 9 | TiO2 | 67,31 | 2,9 |
|  | 10 | SiO2 | 78,97 | 1,458 |
|  | 11 | TiO2 | 60,6 | 2,9 |
|  | 12 | SiO2 | 92,49 | 1,458 |
|  | 13 | TiO2 | 63,23 | 2,9 |
|  | 14 | SiO2 | 70,87 | 1,458 |
| 3 | 15 | TiO2 | 72 | 2,9 |
|  | 16 | SiO2 | 193,08 | 1,458 |
|  | 17 | TiO2 | 64,56 | 2,9 |
|  | 18 | SiO2 | 109,53 | 1,458 |
|  | 19 | TiO2 | 63,25 | 2,9 |
|  | 20 | SiO2 | 170,76 | 1,458 |

OPTOELECTRONIC COMPONENT

CROSS-REFERENCE TO RELATED APPLICATIONS

This application is the National Stage of International Application No. PCT/DE2006/001701, filed on Sep. 27, 2006, which claims the priority to German Patent Applications Serial No. 10 2005 046368.1, filed on Sep. 28, 2005 and Serial No. 10 2005 062514.2, filed on Dec. 27, 2005. The contents of all applications are hereby incorporated by reference in their entireties.

FIELD OF THE INVENTION

This invention relates to an optoelectronic component with wavelength conversion substance.

BACKGROUND

Radiation-emitting optoelectronic components with wavelength conversion substance are described, for example, in the publication WO 97/50132. Such an optoelectronic component comprises a semiconductor body that emits electromagnetic radiation and a wavelength conversion substance that converts a portion of this radiation into radiation with different, usually longer, wavelengths.

As described, for example in the publication DE 101 42 009 A1, the radiation from the semiconductor body can originate from the short-wave ultraviolet spectral region. Since ultraviolet radiation generally damages the human eye, it is proposed in the publication DE 101 42 009 A1 to position a layer opaque to UV beyond the wavelength conversion substance in the direction of radiation of the semiconductor body, which is preferably reflective for ultraviolet radiation on one or both sides.

SUMMARY

This application describes an optoelectronic component that has high efficiency.

An optoelectronic component with high efficiency in particular comprises:
 a semiconductor body that comprises a semiconductor layer sequence that is suitable for generating electromagnetic radiation of a first wavelength that is emitted from the front face of the semiconductor body,
 a first wavelength conversion substance following the semiconductor body in the direction of its emission, which converts radiation of the first wavelength into radiation of a second wavelength different from the first wavelength, and
 a first selectively reflecting layer between the active semiconductor layer sequence and the first wavelength conversion substance that selectively reflects radiation of the second wavelength and is transparent to radiation of the first wavelength.

With the assistance of the first selectively reflecting layer that is placed between the active semiconductor layer sequence and the first wavelength conversion substance, the efficiency of the component is advantageously raised since it prevents converted radiation of the second wavelength from being reflected back into the active semiconductor layer sequence of the semiconductor body and being absorbed there.

In an advantageous embodiment, the first selectively reflecting layer adjoins the semiconductor body, particularly on its radiation-emitting front face. The first selectively reflecting layer in one embodiment at least partially, but preferably completely, covers a surface of the semiconductor body facing the radiation-emitting front face. In another embodiment, it also partially or completely covers the flanks of the semiconductor body, or in other words surfaces of the semiconductor body that are perpendicular to or at least at an angle to the radiation-emitting front face.

It is preferred for the first selectively reflecting layer to be integrated monolithically into the radiation-emitting front face of the semiconductor body. In this embodiment, the first selectively reflecting layer is usually produced by processes that are also used to produce the semiconductor body or are readily compatible with them, for example sputtering or epitaxial growth. This advantageously makes possible a technically simple production process.

Alternatively, the first selectively reflecting layer can also be slurried on, spin-coated, and/or sprayed on.

In still another advantageous embodiment, the first selectively reflecting layer can also be made beside the semiconductor body, for example on the bottom surface of a component housing or a carrier on which the semiconductor body is mounted. If the semiconductor body is mounted in the recess of a component housing with side faces, then it is also preferred to provide the side faces of the component housing adjoining the recess with the first the first selectively reflecting layer. By making the first selectively reflecting layer beside the semiconductor body, converted radiation that would otherwise be absorbed by the component housing is advantageously reflected to the front face of the component.

In another preferred embodiment, alternatively to the first selectively reflecting layer, another smooth or diffusely reflecting layer is produced beside the semiconductor body. It is preferred to make this so that it reflects radiation with a distinctly broader wavelength range that with special preference comprises converted and unconverted radiation. Thus, absorption of unconverted radiation, for example by the material of a component housing or carrier on which the semiconductor body is mounted, is also advantageously distinctly reduced. A metal layer is preferably used as another reflecting layer, which comprises gold or silver, for example. The other reflecting layer as a rule can be produced clearly more easily, since the requirements for its reflectivity are lower.

In an alternative advantageous embodiment, the first selectively reflecting layer does not adjoin the semiconductor body but is spaced away from it. In particular, the first selectively reflecting layer is spaced away from the radiation-emitting front face of the semiconductor body and follows it in the direction of emission.

The direction of emission in particular means the direction established by the separation vector from the plane of the principal dimension of the active semiconductor layer sequence directed to the radiation-emitting front face of the semiconductor body.

In a preferred embodiment, the first wavelength originates from the ultraviolet, blue, or green spectral region. Since wavelength conversion substances generally convert into radiation with longer wavelengths, wavelengths from the short-wave end of the visible spectral region and of the ultraviolet spectral region are especially suitable in connection with their use with wavelength conversion substances.

A semiconductor body that is suitable for emitting ultraviolet, blue, and/or green radiation as a rule comprises an active layer sequence based on a nitride or phosphide compound semiconductor material.

The term "active layer sequence based on a nitride compound semiconductor material" in the present context means an active layer sequence that comprises a nitride III compound semiconductor material, preferable $Al_nGa_mIn_{1-n-m}N$, wherein $0 \leq n \leq 1$, $0 \leq m \leq 1$, and $n+m \leq 1$. It is not absolutely necessary for this material to have a mathematically exact composition according to the formula above. Instead, in particular it can also contain one or more dopants as well as additional constituents that essentially do not change the characteristic physical properties of $Al_nGa_mIn_{1-n-m}N$ material. For simplicity, however, the formula above contains only the essential constituents of the crystal lattice (Al, Ga, In, N), even though they can be partially replaced by small amounts of other substances.

The term "active layer sequence based on a phosphide compound semiconductor material" in the present context also means an active layer sequence that comprises a phosphide III compound semiconductor material, preferably $Al_nGa_mIn_{1-n-m}P$, wherein $0 \leq n \leq 1$, $0 \leq m \leq 1$, and $n+m \leq 1$. It is not absolutely necessary for this material to have a mathematically exact composition according to the formula above. Instead, in particular it can also contain one or more dopants as well as additional constituents that essentially do not change the characteristic physical properties of $Al_nGa_mIn_{1-n-m}P$ material. For simplicity, however, the formula above contains only the essential constituents of the crystal lattice (Al, Ga, In, P), even though they can be partially replaced by small amounts of other substances.

The active layer sequence of the semiconductor body is grown epitaxially, for example, and preferably comprises a pn junction, a double hetero structure, a single-quantum well, or with special preference a multiple-quantum well (MQW) to generate radiation. The designation of quantum well structure here includes no information on the dimensionality of the quantization. Thus it comprises quantum troughs, quantum wires, and quantum points, and any combination of these structures. Examples of MQW structures are described in the publications WO 01/39282, U.S. Pat. No. 5,831,277, U.S. Pat. No. 6,172,382 B1, and U.S. Pat. No. 5,684,309, the disclosed contents of which are incorporated herewith by back reference.

A luminescent diode chip (LED chip for short), for example, can be used as the semiconductor body.

If the first wavelength originates from the visible spectral region, for example from the blue or green spectral region, then the component preferably emits mixed radiation that comprises radiation of the first wavelength and radiation of the second wavelength. By selection and concentration of the wavelength conversion substance, components are produced so that their color point can be set within a broad range. It is especially preferred for the mixed radiation to comprise radiation of different colors in such a way that the mixed radiation lies in the white region of the CIE standard color space.

It is particularly preferred to use a semiconductor body that emits radiation of a first wavelength from the blue spectral region in combination with a wavelength conversion substance that converts this blue radiation into radiation of a second wavelength from the yellow spectral region. An optoelectronic component can thus be realized advantageously in a technically simple manner that emits mixed radiation with a color point in the white region of the CIE standard color space.

However, if the semiconductor used emits only radiation of a first wavelength from the invisible spectral region, for example from the ultraviolet, then it is desirable to convert this radiation as completely as possible, since it does not contribute to the brightness of the component. In the case of short-wave radiation such as UV radiation, it can even damage the human eye. For this reason, measures are preferred with such components that are intended to prevent the component from emitting short-wave radiation. Such measures, for example, can be absorber particles or reflecting elements that follow the first wavelength conversion substance in the direction of emission of the semiconductor body, and that absorb or reflect back to the wavelength conversion substance the undesired short-wave radiation.

In a preferred embodiment, the optoelectronic component comprises a second wavelength conversion substance that converts radiation of the first wavelength into radiation of a third wavelength different from the first and second wavelengths.

As already explained, when a semiconductor body is used that emits only radiation of a first wavelength from invisible spectral regions, for example ultraviolet radiation, the most complete possible conversion of this radiation is desirable as a rule. By using a second wavelength conversion substance that converts radiation of the first wavelength into radiation of a third wavelength different from the first and second wavelengths, it is advantageously possible to produce a component that emits mixed radiation consisting of radiation of the second wavelength and radiation of the third wavelength. If the first wavelength originates from the ultraviolet spectral region, it is preferred to select a first wavelength conversion substance that converts a portion of the radiation of the first wavelength into radiation of a second wavelength from the yellow spectral region and a second wavelength conversion substance that converts the rest of the radiation of the first wavelength into radiation of a third wavelength from the blue spectral region.

If the component comprises a semiconductor body that emits only radiation of a first wavelength from the invisible ultraviolet spectral region, then measures intended to prevent the component from emitting short-wave radiation preferably follow all wavelength conversion substances in the direction of emission of the semiconductor body.

If the semiconductor body emits radiation of a first wavelength from the visible spectral region, then when a second wavelength conversion substance is used, the optoelectronic component preferably emits mixed radiation that contains radiation of the first, second, and third wavelengths. With such a component, the color point of the mixed radiation can beneficially be set within particularly broad regions of the CIE standard color space.

In a preferred embodiment, the semiconductor body, the first wavelength conversion substance, and the second wavelength conversion substance, are matched to one another in such a way that the first wavelength originates from the blue spectral region, the second wavelength originates from the red spectral region, and the third wavelength originates from the green spectral region. Mixed radiation with a color point in the white region of the CIE standard color space can be produced in this way.

If a second wavelength conversion substance is used, the first selectively reflecting layer is preferably made so that in addition to the radiation of the second wavelength, it also selectively reflects the radiation of the third wavelength, so that the radiation converted by the second wavelength conversion substance is also not absorbed in the active semiconductor layer sequence of the semiconductor body.

It is especially preferred for the optoelectronic component to emit mixed radiation with a color point in the white region of the CIE standard color space, since these have many uses, for example for the backlighting of displays or in vehicle lights.

In a preferred embodiment, the semiconductor body is provided with a shell transparent to the radiation of the component, which protects the semiconductor body from mechanical and chemical environmental influences, for example.

In another expedient embodiment, the first wavelength conversion substance is enclosed by the shell. Alternatively, the first wavelength conversion substance can also be enclosed in a wavelength conversion layer. A wavelength conversion layer provides the benefit that it is easy to produce reproducibly, and also contributes to a largely homogeneous color effect of the component, since the path length of the radiation within a wavelength conversion layer is easily standardized compared to the path length in a shell. It is especially preferred for the wavelength conversion layer to have a constant thickness, since this effect is then beneficially especially manifested.

If a second wavelength conversion substance is used, then the shell or the first wavelength conversion layer can also contain the second wavelength conversion substance in addition to the first wavelength conversion substance. It is also possible for the second wavelength conversion substance to be contained in a second wavelength conversion layer. The second wavelength conversion layer preferably also has a constant thickness for the reasons mentioned above.

In an advantageous embodiment, one of the wavelength conversion layers adjoins the semiconductor body, especially if the first selectively reflecting layer is integrated into the latter monolithically.

If the first selectively reflecting layer adjoins the semiconductor body without being monolithically integrated into it, or if it is spaced away from the semiconductor body, one of the wavelength conversion layers in another embodiment adjoins the first selectively reflecting layer, expediently adjoining a surface of the first selectively reflecting layer that faces away from the semiconductor body.

Alternatively, the first or the first and second wavelength conversion layer(s) is/are spaced away from the semiconductor body and from the first selectively reflecting layer.

For example, the optoelectronic component in one embodiment comprises a covering element that comprises the first and/or the second wavelength conversion layer(s).

Alternatively or in addition, the covering element can also comprise the first selectively reflecting layer. It is preferred for the covering element to have a carrier substrate that comprises glass, for example, or consists of glass, onto which the first wavelength conversion layer, the second wavelength conversion layer, and/or the first selectively reflecting layer is/are applied. In an expedient configuration, the carrier substrate has a principal surface facing the semiconductor body and/or a principal surface facing away from the semiconductor body. It is then preferred for the first selectively reflecting layer to be applied to the principal surface of the carrier substrate facing the semiconductor body and/or for the first wavelength conversion layer to be applied to the principal surface of the carrier substrate facing away from the semiconductor body.

Advantageously, the optoelectronic component can be produced especially easily with such a covering element. For example, it is especially easy to produce the first wavelength conversion layer on the carrier substrate.

A covering element that comprises in particular the first selectively reflecting layer and the first and optionally the second wavelength conversion layer, is preferably used with an optoelectronic component in which the semiconductor body is mounted in a recess, perhaps a reflector tub, which is part of a component housing, for example. The recess in one embodiment is filled at least partially with the shell. As a rule, the semiconductor body is electrically contacted on its radiation-emitting front face by means of a bond wire, for example.

It is advantageous in this embodiment that the first selectively reflecting layer of the covering element prevents fluorescence radiation emitted in the first and/or second wavelength conversion layer from striking the walls of the recess and the bond wire. In this way, the covering element with the first selectively reflecting layer beneficially prevents further absorption losses in the optoelectronic component besides absorption losses in the semiconductor body, as on the reflector tub and/or the bond wire. The component is therefore especially efficient.

Because of the first selectively reflecting layer, it is irrelevant for absorption losses in the component how far the covering element with the first and/or second wavelength conversion layer is from the semiconductor chip, and in particular from the component. A great separation to minimize absorption losses can be dispensed with. In a preferred embodiment, the covering element is positioned directly after the reflector tub and/or the shell. For example, it is cemented to the reflector tub and/or the shell. In this way, the radiation-emitting surface of the covering element is advantageously particularly small, so that the component represents a light source of small size, which can be imaged well optically.

With particular preference, the shell comprises a matrix material and particles of the first and/or second wavelength conversion substance that are embedded in the matrix material of the shell. It is especially preferred for the particles of the first and optionally of the second wavelength conversion substance to be distributed homogeneously in the matrix material, since this advantageously simplifies homogenizing the color effect of the component.

In an expedient configuration of the component, the first and/or optionally the second wavelength conversion layer also comprise(s) a matrix material and particles of the first and/or second wavelength conversion substance that are embedded in the matrix material of the first and/or optionally of the second wavelength conversion layer, and with special preference are homogeneously distributed therein.

If two wavelength conversion substances are used in the component, then they are spatially separated in one embodiment in such a way that the component comprises two regions different from one another, each of which has only one of the two wavelength conversion substances. Thus the two wavelength conversion substances can be spatially separated from one another, for example, by the first wavelength conversion substance being contained in the shell of the semiconductor body and the second wavelength conversion substance being contained in a second wavelength conversion layer adjoining the semiconductor body. It is also possible to separate the two wavelength conversion substances spatially by including them in two different wavelength conversion layers, one of which adjoins the semiconductor body, for example, and with the other following it in the direction of emission of the semiconductor body.

If the two wavelength conversion substances are spatially separated, then it is especially preferred for the region that contains the first wavelength conversion substance and the region that contains the second wavelength conversion substance to be positioned following the radiation-emitting front face of the semiconductor body so that the wavelength into which radiation of the first wavelength is converted by the particular wavelength conversion substance viewed in the direction of emission of the semiconductor body is always shorter than the wavelength into which the preceding wavelength converting substance relative to the direction of emission of the semiconductor body converts the radiation of the first wavelength. Such a spatially separated arrangement of the wavelength conversion substances provides the benefit that absorption of radiation already converted by the one wavelength conversion substance by the other wavelength conversion substance can be especially effectively reduced.

In another preferred embodiment, a second selectively reflecting layer follows the first wavelength conversion substance and optionally the second wavelength conversion substance in the direction of emission of the semiconductor body, which selectively reflects a given fraction of the radiation of the first wavelength and is transparent to another fraction of the radiation of the first wavelength, as well as to radiation of the second wavelength, and optionally to radiation of the third wavelength. Using such a second selectively reflecting layer, the probability of radiation of the first wavelength being converted by the first or optionally the second wavelength conversion substance can be increased. In this way, the fraction of converted radiation can be selectively increased, and therefore a component with a smaller amount of wavelength conversion substance can advantageously be realized compared to a component without a second selectively reflecting layer.

In an advantageous embodiment, the active semiconductor layer sequence during operation of the component emits a large fraction of the electromagnetic radiation with the first wavelength perpendicular to its principal dimensional plane. In other words, the electromagnetic radiation emitted by the active semiconductor layer sequence is practically completely or at least in large part directed parallel to the normal to the surface at the principal dimensional plane of the active semiconductor layer sequence.

Such directed radiation can be generated, for example, with a semiconductor body that is a thin-film LED chip. A thin-film LED chip to a good approximation is a Lambert surface radiator. In particular, the radiant intensity of the emitted electromagnetic radiation to a good approximation decreases with the cosine of the angle between the normal to the surface at the active semiconductor layer sequence and the direction in which the radiation is emitted.

A thin-film LED chip is distinguished in particular by the following characteristic features:

A reflector layer that reflects at least part of the electromagnetic radiation generated in the active semiconductor layer sequence back into the semiconductor body is applied or developed, especially grown epitaxially, on a first principal surface of the semiconductor body facing toward a carrier element—in other words on the back of the semiconductor body opposite the radiation-emitting front face;

The semiconductor body has a thickness in the range of 20 µm or less, especially in the range of 10 µm; and The semiconductor body contains at least one semiconductor layer with at least one surface that has a blended structure, which in the ideal case leads to an approximately ergodic distribution of the light in the semiconductor body, i.e. it has the most ergodic possible stochastic scattering properties.

A basic principle of a thin-layer LED chip, for example, is described in the publication I. Schnitzer et al., Appl. Phys. Lett. 63 (16), Oct. 18, 1993, 2174-2176, the disclosure content of which to that extent is herewith incorporated by back reference. Examples of thin-layer LED chips are described in the publications EP 0905797 A2 and WO 02/13281, the disclosure content of which to that extent is herewith incorporated by back reference.

In an expedient embodiment, the first and/or optionally the second selectively reflecting layer has/have a layer sequence with dielectric layers with alternating high and low index of refraction. With special preference, the first and/or optionally the second selectively reflection layer with a layer sequence of dielectric layers with alternating high and low indices of refraction is a Bragg reflector, since such a reflector as a rule shows lower absorption of reflected radiation than other reflecting layers, for example metal layers. A Bragg reflector is familiar to one skilled in the art and will therefore not be explained in further detail at this point.

In an advantageous embodiment, the first selectively reflecting layer has high transmissivity and especially low reflectivity for electromagnetic radiation with a wavelength that is smaller than a limiting wavelength $\lambda_G$. The first selectively reflecting layer in this embodiment is preferably made as a layer sequence with dielectric layers with alternating high and low refractive index, which represent in particular a Bragg reflector.

On the other hand, the first selectively reflecting layer has high reflectivity and especially low transmissivity for electromagnetic radiation with a wavelength that is larger than a limiting wavelength $\lambda_G$. The transition between the wavelength region for which the selectively reflecting layer has high reflectivity and the wavelength region for which it has high transmissivity is as sharp as possible, for example within a wavelength range of less then or equal to 10 nm, preferably less then or equal to 5 nm, for example about 3 nm around the limiting wavelength $\lambda_G$.

The selectively reflecting layer in this embodiment preferably represents a short-pass filter, often also called a high-pass filter, with the limiting wavelength $\lambda_G$. That is to say, the first selectively reflecting layer is essentially transparent to electromagnetic radiation for which it has high transmissivity and reflects essentially completely electromagnetic radiation for which it has high reflectivity. In other words, the selectively reflecting layer preferably transmits radiation whose wavelength is smaller than the limiting wavelength $\lambda_G$ practically completely, and preferably reflects radiation whose wavelength is smaller [sic] than the limiting wavelength $\lambda_G$ practically completely.

In another advantageous embodiment, the limiting wavelength $\lambda_G$ changes with the angle of incidence of the electromagnetic radiation on the first selectively reflecting layer. For example, with perpendicular radiation incidence, corresponding to an angle of incidence of 0°, the limiting wavelength $\lambda_G$ is at its maximum, and declines with increasing angle of incidence. For example, the limiting wavelength $\lambda_G$ is 20 nm or more smaller, preferably 50 nm or more smaller, for radiation with angle of incidence of 45° than the limiting wavelength $\lambda_G$ for radiation with an angle of incidence of 0°. This property can be produced with a Bragg reflector, for example, in a manner familiar to one skilled in the art, and will therefore not be explained further at this point.

The limiting wavelength is preferably chosen so that electromagnetic radiation of the first wavelength, which is emitted by the active semiconductor layer sequence perpendicular to the principal dimensional plane of the component during its operation, is transmitted by the first selectively reflecting layer. Electromagnetic radiation of the first wavelength that strikes the first selectively reflecting layer at an angle, on the other hand, is reflected by it. It is particularly preferred for the limiting wavelength $\lambda_G$ for electromagnetic radiation with perpendicular incidence to be only slightly larger than the first wavelength. For example, the limiting wavelength $\lambda_G$ for electromagnetic radiation with perpendicular incidence is 5 nm to 100 nm, preferably 10 nm to 50 nm, and with particular preference 20 nm to 50 nm larger than the first wavelength, including the limits in each case.

Advantageously in this way, electromagnetic radiation of the first wavelength that is back-scattered to the semiconductor body, for example in the first and/or second wavelength conversion layer, in the shell, or otherwise, without wavelength conversion, and does not strike the first selectively reflecting layer perpendicularly but at an angle, is not absorbed in the semiconductor body. Thus the scattered radiation of the first wavelength also contributes to the emission of the component. In addition, the radiation of the first wavelength emitted by the semiconductor body that is emitted perpendicular or almost perpendicular to the principal dimensional plane of the active semiconductor layer sequence passes practically completely through the first selectively reflecting layer. Thus, especially with thin-film LED chips that emit electromagnetic radiation of the first wavelength mostly perpendicular to the principal dimensional plane of the active semiconductor sequence during operation, the radiation yield of the component is beneficially further increased.

It should be pointed out that the semiconductor body as a rule does not emit radiation of a single first wavelength, but radiation of multiple different first wavelengths, that preferably is included in a common first wavelength range. The first or optionally the second wavelength conversion substance converts radiation of at least one single first wavelength into radiation of at least one other second or third wavelength. As a rule, the first or optionally the second wavelength conversion substance converts multiple first wavelengths that are preferably included in a first wavelength range into radiation of multiple other second or third wavelengths, which in turn are preferably included in another common second or third wavelength range.

The first and/or the second wavelength conversion substance converts radiation of the first wavelength into radiation of the second and/or third wavelength by absorbing it, thereby passing into an excited state, and reverting to its ground state by reemission of radiation of a longer wavelength.

Other benefits and advantageous embodiments and improvements of the invention are described by the five examples of embodiment explained below in further detail in combination with FIGS. 1A to 5.

Figures 1C, 1D:
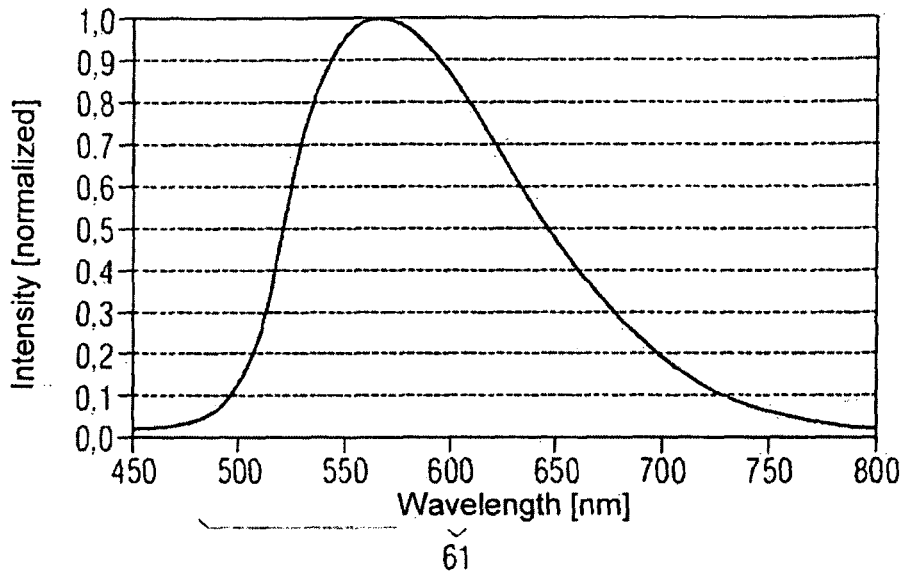
FIG. 1A, a schematic cross-sectional view of an optoelectronic component pursuant to a first example of embodiment, FIG. 1B, emission spectrum of a semiconductor body pursuant to the first example of embodiment, FIG. 1C, emission spectrum of a wavelength conversion substance pursuant to the first example of embodiment, FIG. 1D, tabular presentation of a layer sequence of a selectively reflecting layer pursuant to the first example of embodiment, FIG. 1E, illustration of the refractive index curve as a function of layer thickness according to the layer sequence from FIG. 1D, FIG. 1F, reflectivity of the selectively reflecting layer according to FIGS. 1D and 1E, FIG. 1G, schematic cross-sectional view of an optoelectronic component pursuant to a variant of the first example of embodiment, FIG. 2, schematic cross-sectional view of an optoelectronic component pursuant to a second example of embodiment, FIG. 3, schematic cross-sectional view of an optoelectronic component pursuant to a third example of embodiment, FIG. 4, schematic cross-sectional view of an optoelectronic component pursuant to a fourth example of embodiment, FIG. 5, schematic cross-sectional view of an optoelectronic component pursuant to a fifth example of embodiment, and FIG. 6, schematic cross-sectional view of an optoelectronic component pursuant to a sixth example of embodiment.

Identical constituents or constituents with the same actions in the examples of embodiment and in the Figures are given the same reference symbols in each case. The elements shown and the sizes are basically not to be seen as drawn to scale, but individual elements, for example layer thicknesses or particle sizes, may be shown in exaggerated sizes for better understanding and/or better clarity.

DETAILED DESCRIPTION

In the example of embodiment of the optoelectronic component according to FIG. 1A, a luminescent diode chip ("LED chip" for short) is used as semiconductor body 1 that comprises an active semiconductor layer sequence 2 that is based in this case on a nitride compound semiconductor material. The semiconductor layer sequence 2 in operation generates radiation of a first wavelength from the blue spectral region, which is emitted in operation from the front face 3 of the semiconductor body 1. The emission spectrum of an active semiconductor sequence 2 that emits radiation of a first wavelength from the blue spectral region is shown in FIG. 1B by way of example. As shown here, the first wavelengths that the semiconductor emits are encompassed by a first wavelength range 21 that has an intensity maximum at about 460 nm.

The semiconductor body 1 in this case is mounted on a carrier 4, for example a printed circuit board, and is enclosed by a shell 5 that comprises a first wavelength conversion substance 6 and a matrix material 7. The first wavelength conversion substance 6 converts the radiation of the first wavelength into radiation of a second wavelength different from the first wavelength, which in this case originates from the yellow spectral region, for example.

YAG:Ce, for example, or another garnet-based luminophor, for example such as $(Y_aLu_bGd_cTb_d)_3(Al_xGa_y)_5O_{12}$:Ce, can be used as the first wavelength conversion substance 6 that converts the radiation of the first wavelength from the blue spectral region, as shown in FIG. 1B for example, into a radiation of a second wavelength from the yellow spectral region. The proportions a, b, c, and d can be greater than or equal to 0 and smaller than or equal to 1, and a+b+c+d=1. Correspondingly, x and y are preferably greater than or equal to 0 and smaller than or equal to 1, and x+y=1. Among these luminophors, for example, are cerium-doped TbAl garnet-based luminophor and cerium-doped (Y,Gd)Al garnet-based luminophor.

Other suitable luminophors that in particular emit radiation in the yellow wavelength region, for example, are an orthosilicate luminophor doped with a rare earth metal, for example such as $A_2SiO_4$:$Eu^{2+}$, wherein A can stand for Sr and/or Ba, and an oxynitride luminophor such as (Ca,Sr,Ba)$Si_2O_2N_2$:Eu.

Alternatively or in addition, for example for color matching, a luminophor can be used that converts radiation of the first wavelength, perhaps from the blue spectral region as shown in FIG. 1B by way of example, into radiation of a second wavelength from the red spectral region. Among these luminophors are sulfidic systems such as (Sr,Ca)S:Eu for example, and nitridic luminophors such as $(Sr,Ca)_2Si_5N_8$:Eu or $CaAlSiN_3$:Eu, as well as luminophors chemically related to these systems.

The emission spectrum of a wavelength conversion substance 6 that converts radiation of a first wavelength from the blue spectral region into radiation of a second wavelength from the yellow spectral region is shown in FIG. 1C by way of example. As seen here, the second wavelengths that the first wavelength conversion substance 6 emits are also encompassed by a second wavelength range 61. The intensity maximum of this emission spectrum is at about 560 nm.

In the example of embodiment according to FIG. 1A, the first wavelength conversion substance 6 is in the form of particles that are preferably essentially homogeneously distributed in the matrix material 7 of the shell 5.

"Essentially homogeneously distributed" in this context means that the particles of the wavelength conversion substance 6 are uniformly distributed to the greatest possible extent at least in a partial volume of the matrix material 7. In particular, it means that the particles to the greatest possible extent are not agglomerated at all or only negligibly so. Of course this does not exclude the occurrence of a slight deviation of the arrangement of particles in the matrix material 7 from an ideal equal distribution, for example because of sedimentation of the particles during the hardening of the matrix material 7.

A first selectively reflecting layer 8 here covers the surface and the flanks 1001 of the semiconductor body 1 facing the radiation-emitting front face 3 (cf. FIG. 1A). The first selectively reflecting layer 8 reflects radiation of the second wavelength selectively into the shell 5 and is transparent to radiation of the first wavelength.

The first selectively reflecting layer 8, for example, comprises a sequence of dielectric layers with alternating low and high refractive index. It is preferred for the refractive index difference between the materials to be high, so that the number of layers is kept small. The dielectric materials used also preferably absorb radiation of the first wavelength and radiation of the second wavelength only slightly. A layer sequence that is suitable for use as the first selectively reflecting layer 8 in the first example of embodiment according to FIGS. 1A to 1C is listed in tabular form in FIG. 1D.

Silicon dioxide ($SiO_2$) with a refractive index of about 1.5 is used here as the material with low refraction. These $SiO_2$ layers with low refraction alternate with layers with high refraction, which comprise titanium dioxide ($TiO_2$) with a refractive index of about 2.9, for example. Magnesium fluoride ($MgF_2$), aluminum oxide ($Al_2O_3$), tantalum oxide (TaO), or hafnium dioxide ($HfO_2$), for example, can also be used as materials with high refraction. These layers can be vapor-deposited as a rule, perhaps by a thermal vaporization process and/or sputtered on using an electron beam, or can be applied by a chemical method (chemical vapor deposition, "CVD" for short).

A layer sequence of epitaxially grown layers can also be applied as the first selectively reflecting layer 8, which is made up of alternating layers of GaN and $Al_xGa_{1-x}N$, for example, with the refractive index differential between the layers being set suitably by choice of the proportion of aluminum.

As another alternative, the first selectively reflecting layer 8 can be slurried on, spin-coated, or sprayed on. For example, a sequence of layers, such as $SiO_2$ and $TiO_2$ layers, can be applied by a sol-gel method. A photolacquer layer or polymer layer, especially a sequence of photolacquer and/or polymer layers with alternating high and low refractive indices, is preferably sprayed on or spin-coated.

Figure 1E:
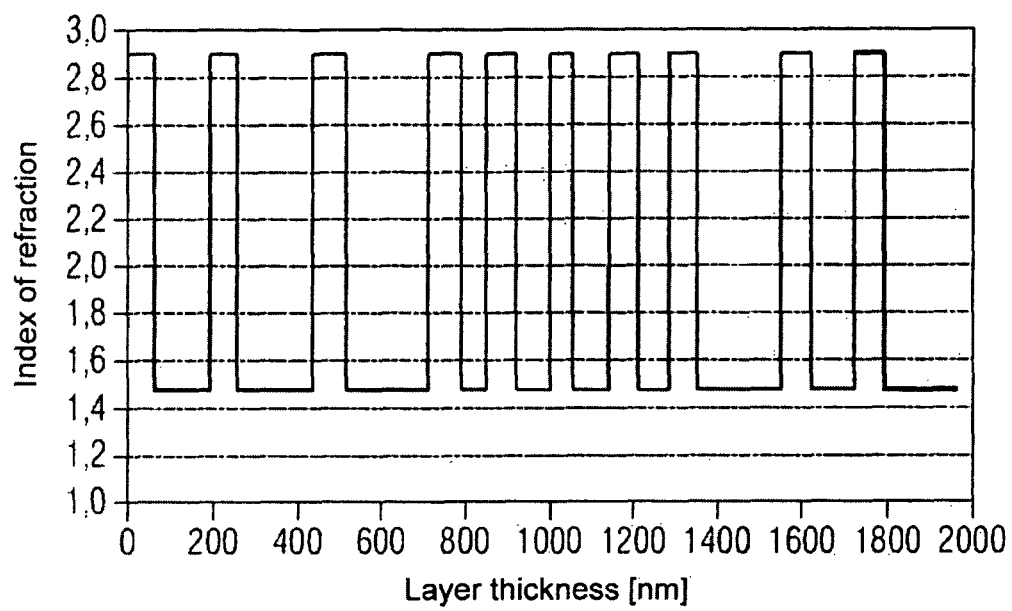

FIG. 1E shows the refractive index of the layer sequence of the first selectively reflecting layer 8 as a function of layer thickness according to the tabular listing of FIG. 1D. The layer sequence according to FIGS. 1D and 1E comprises a sequence of ten pairs of layers, each of which has an $SiO_2$ layer with a low refractive index of about 1.5 and a $TiO_2$ layer with a high refractive index of about 2.9. The layer sequence is also structured so that pairs of layers are combined into layer packets whose $SiO_2$ and $TiO_2$ layers have similar thicknesses in each case.

As seen in FIGS. 1D and 1E, the first layer packet comprises layers one to six, or three pairs of layers, each consisting of a $TiO_2$ layer (high refractive index of about 2.9) and an $SiO_2$ layer (low refractive index of about 1.5), with the thicknesses of the $TiO_2$ layers being between about 60 nm and about 80 nm and the thicknesses of the $SiO_2$ layers being between about 128 nm and about 200 nm. The second layer packet comprises the layers seven to fourteen, or four pairs of layers, each consisting of a $TiO_2$ layer and an $SiO_2$ layer, with the thicknesses of the $TiO_2$ layers being between about 60 nm and about 80 nm and the thicknesses of the $SiO_2$ layers being between about 60 nm and about 95 nm. The third layer packet is similar in structure to the first layer packet. It comprises the layers fifteen to twenty, with the thicknesses of the $TiO_2$ layers being between about 60 nm and about 80 nm, and the thicknesses of the $SiO_2$ layers being between about 110 nm and about 200 nm. The thickness differential between the low-refraction $SiO_2$ layer and the high-refraction $TiO_2$ layer of a pair of layers is thus distinctly greater in the first and third layer packets than in the second layer packet.

Figure 1F:
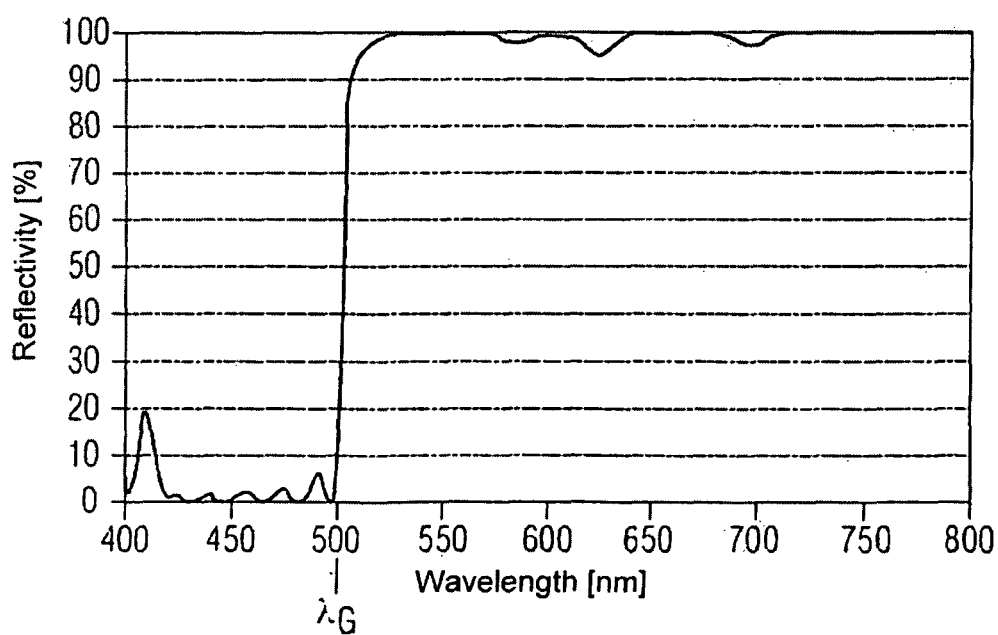

The layer sequence according to FIGS. 1D and 1E reflects radiation selectively, as shown by the reflection spectrum of FIG. 1F. The reflectivity of this layer sequence is low for wavelengths $\lambda < \lambda_G$, while it is almost 100% for wavelengths $\lambda > \lambda_G$, with the limiting wavelength $\lambda_G$ being 500 nm. The high reflectivity over a relatively broad wavelength range (from about 500 nm to about 800 nm) is produced in particular by the structure described above with the different thicknesses of high-refraction and low-refraction layers.

In the component according to FIG. 1A, radiation of the first wavelength from the blue spectral region is generated in the active semiconductor body sequence 2, and is emitted from its front face 3 except for small fractions of the radiation that are emitted from the flanks 1001 of the semiconductor body 1. Since the first selectively reflecting layer 8 is transparent to the radiation of the first wavelength, it passes through it almost unhindered and penetrates into the shell 5 with the first wavelength conversion substance 6. When radiation of the first wavelength strikes a particle of the first wavelength conversion substance 6, it is converted into radiation of the second wavelength from the yellow spectral region. By passing through the shell 5, a portion of the radiation of the first wavelength is thus converted into radiation of the second wavelength, while another portion of the radiation of the first wavelength passes through the shell 5 without conversion, so that the component emits mixed radiation with a color point in the white region of the CIE standard color space, which comprises radiation of the first wavelength from the blue spectral region and radiation of the second wavelength from the yellow spectral region. When converted radiation of the second wavelength strikes the first selectively reflecting layer 8 it is reflected back into the shell 5 by it, and is beneficially not absorbed by the semiconductor body 1.

Figure 1G:
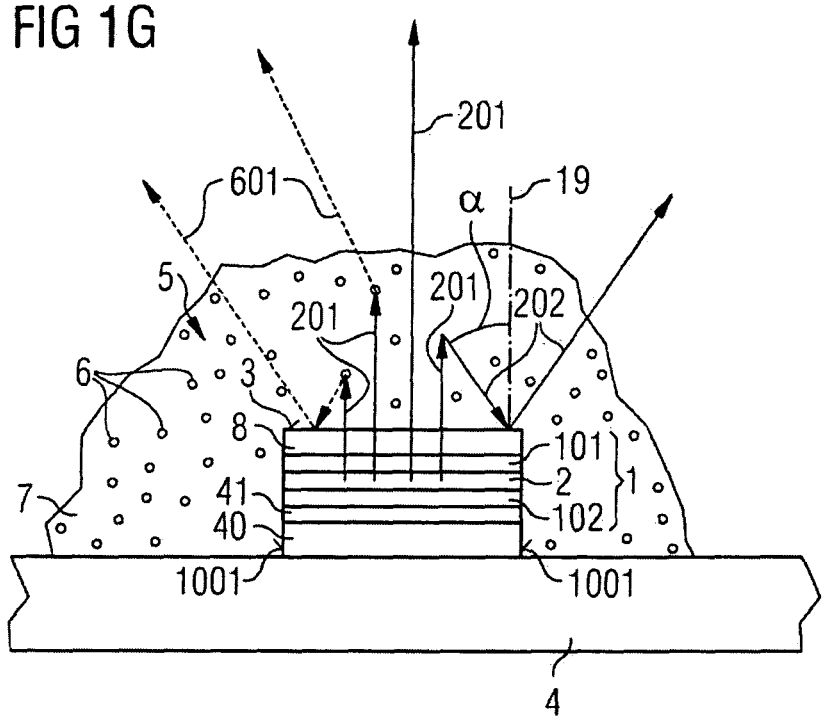

In the variant of the first example of embodiment shown in FIG. 1G, the limiting wavelength $\lambda_G$ depends on the angle of incidence a relative to the normal 19 to the surface of electromagnetic radiation 201, 202, 601 incident upon the first selectively reflecting layer 8. In this case it decreases with increasing angle of incidence α.

For example, the active semiconductor layer sequence 2 in operation emits radiation of the first wavelength 201, perhaps with a wavelength λ=470 nm, essentially perpendicular to the principal dimensional plane of the active semiconductor layer sequence 2. This radiation 201 strikes essentially perpendicularly (α=0°) the first selectively reflecting layer 8, whose limiting wavelength for radiation striking perpendicularly $\lambda_G$ (α=0°) is 490 nm in this case, so that the emitted radiation 201 can pass through the first selectively reflecting layer 8.

A portion of the electromagnetic radiation of the first wavelength 201 is converted by the wavelength conversion substance 6 into electromagnetic radiation 601 of a longer wavelength, for example with a wavelength in the yellow spectral region, perhaps 600 nm. The converted electromagnetic radiation 601 is reflected by the first selectively reflecting layer 8, in particular at all angles of incidence α.

Another portion 202 of the electromagnetic radiation of the first wavelength 201 is scattered without wavelength conversion, for example by the matrix material 7, and strikes the first selectively reflecting layer 8 at an angle α>0°, for example α=45°. The limiting wavelength for radiation that strikes the first selectively reflecting layer, $\lambda_G$ (α=45°), at an angle α=45°, is, for example, 450 nm, so that the radiation 202, which is scattered without wavelength conversion, is reflected by the first selectively reflecting layer 8 and contributes to the emission of the component.

The selectively reflecting layer 8 is monolithically integrated into the front face 3 of the semiconductor body in the example of embodiment illustrated in FIG. 1G. For example, it is made up alternately of epitaxially grown GaN layers and $Al_xGa_{1-x}N$ layers and represents a Bragg reflector. In contrast to the example of embodiment of FIG. 1A, the flanks 1001 of the semiconductor body 1 are free of the selectively reflecting layer 8.

The semiconductor body 1 in this case is a thin-film LED chip with a thickness of less than or equal to 20 μm, for example 10 μm. The thin-film LED chip 1 is based on a nitride compound semiconductor material and comprises an n-doped layer 101, in this case an n-doped charge carrier inclusion layer ("confinement layer"), the active layer or active semiconductor layer sequence 2, and a p-doped charge carrier inclusion layer 102.

Production of the thin-film LED chip comprises the epitaxial growth of the semiconductor body 1 on a growth substrate. The n-doped charge carrier inclusion layer 101 here is adjoined to the growth substrate and the p-doped charge carrier inclusion layer faces away from the growth substrate.

The thin-film LED chip 1 is fastened to a secondary carrier 40. There is a reflector layer 41 between the secondary carrier 40 and the semiconductor body 1, on the principal surface of the semiconductor body 1, which adjoins to the p-doped charge carrier inclusion layer 102. The growth substrate adjoined to the n-doped charge carrier inclusion layer 101 is thinned or removed.

The thin-film LED chip 1, for example the n-doped and/or the p-doped charge carrier inclusion layer 101, 102, has a surface or layer with a blended structure that leads to an approximately ergodic distribution of light in the semiconductor body. The semiconductor body 1 has an approximately Lambert emission characteristic, so that a large portion of the light is emitted perpendicular to the principal dimensional plane of the active semiconductor layer sequence 2.

Figure 2:
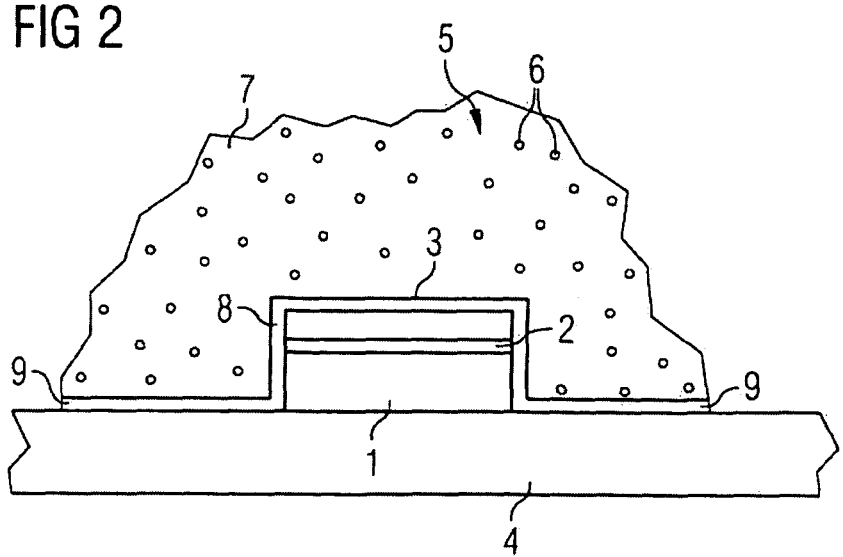

In the optoelectronic component according to the example of embodiment of FIG. 2, differently from the example of embodiment according to FIGS. 1A and 1G, the first selectively reflecting layer 8 is also developed beside the semiconductor body 1 on the bottom of the carrier 4. Alternatively to the first selectively reflecting layer 8, a layer 9 that that reflects smoothly or diffusely over a broad wavelength range of visible light, that does not reflect selectively, can also be developed beside the semiconductor body 1, for example a layer that comprises gold or silver.

Figure 3:
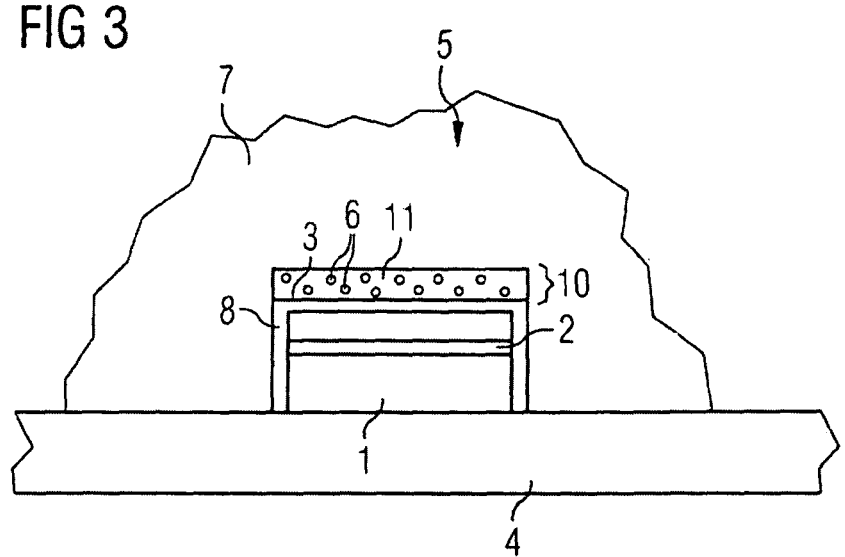

Differently from the examples of embodiment according to FIGS. 1A, 1G, and 2, the first wavelength conversion substance 6 in the optoelectronic component according to FIG. 3 is not enclosed in the shell 5, but is enclosed by a wavelength conversion layer 10 that is applied on the front face 3 of the semiconductor body 1 adjoined to the first selectively reflecting layer 8. Like the shell 5, the first wavelength conversion layer 10 has a matrix material 11, in which the particles of the first wavelength conversion substance 6 are preferably essentially homogeneously distributed.

Figure 4:
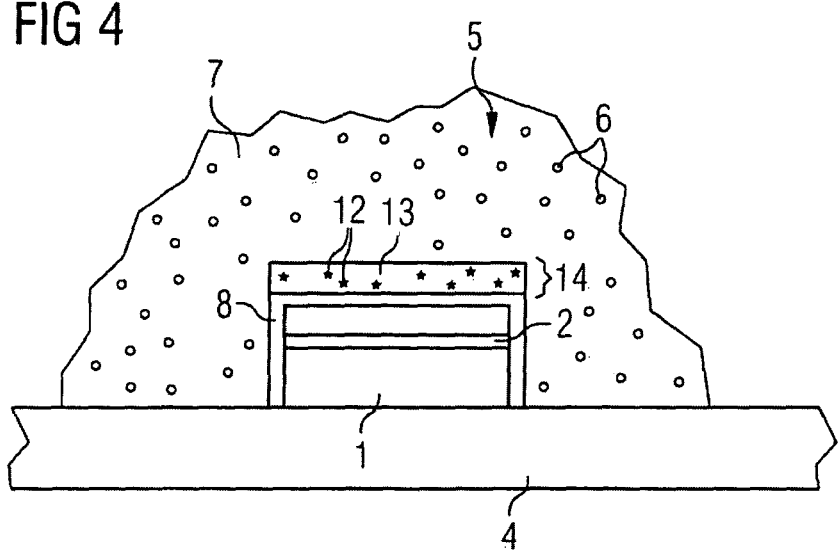

Differently from the examples according to FIGS. 1A, 1G, 2, and 3, the optoelectronic component according to FIG. 4 comprises a second wavelength conversion substance 12 that converts a portion of the radiation of the first wavelength into radiation of a third wavelength different from the first and second wavelengths. The second wavelength conversion substance 12 in this case likewise has particles that are preferably essentially homogeneously distributed in a matrix material 13 of a second wavelength conversion layer 14. The second wavelength conversion layer 14, like the first wavelength conversion layer 10 in the example of embodiment according to FIG. 3, is placed adjoining the first selectively reflecting layer 8, which is enclosed by the front face 3 of the semiconductor body 1.

The second wavelength conversion layer 14 with the wavelength conversion substance 12, for example, can be used in combination with a semiconductor body 1 whose active semiconductor layer sequence 2 generates electromagnetic radiation of a first wavelength from the ultraviolet region. In this case, the second wavelength conversion substance 12 preferably converts a portion of the ultraviolet radiation from the semiconductor body 1 into radiation of a third wavelength from the yellow spectral region, while another portion of the radiation of the first wavelength from the ultraviolet spectral region is preferably converted by the first selectively reflecting conversion substance 6 into radiation of a second wavelength from the blue spectral region, so that the component emits mixed radiation consisting of radiation of the first wavelength and radiation of the second wavelength with a color point in the white region of the CIE standard color space. It is preferred for the radiation of the first wavelength to be converted completely by the first wavelength conversion substance 6 and the second wavelength conversion substance 12 into radiation of the second and third wavelengths.

The second wavelength conversion substance 12, for example contained in a second wavelength conversion layer 14 as in FIG. 4, however, can also be used in combination with a semiconductor body 1 that emits radiation of a first wavelength from the visible region, for example the blue spectral region. In this case, the second wavelength conversion substance 12 in the wavelength conversion layer 14 converts a portion of the radiation of the first wavelength into radiation of a third wavelength from the red spectral region, while the first wavelength conversion substance 10 in the shell 5 converts another portion of the radiation of the first wavelength from the blue spectral region into radiation of a second wavelength from the green spectral region. The component in this case likewise emits mixed radiation with a color point in the white region of the CIE standard color space, which comprises radiation of the first wavelength from the blue spectral region, radiation of the second wavelength from the green spectral region, and radiation of the third wavelength from the red spectral region.

Figure 5:
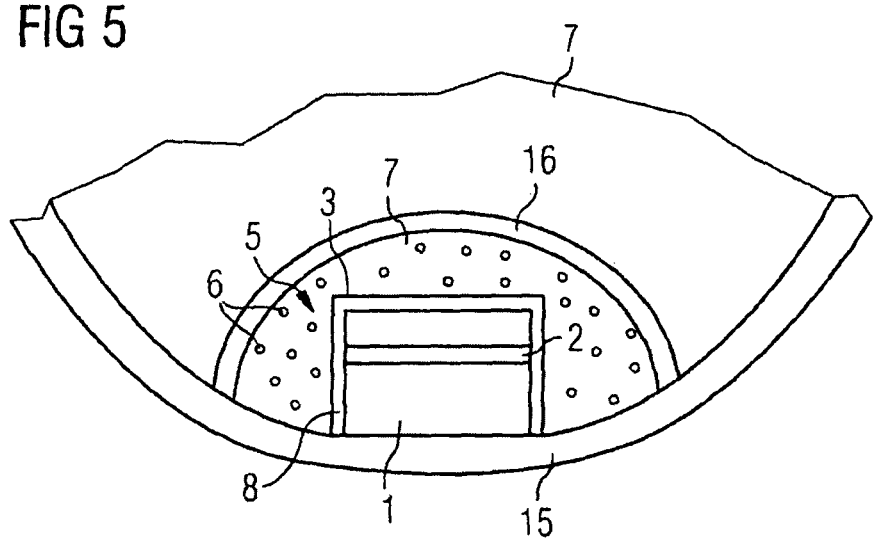

Differently from the examples of embodiment according to FIGS. 1A, 1G, 2, 3, and 4 described above, the semiconductor body 1 in the component according to the example of embodiment of FIG. 5 is not mounted on a carrier 4, but in a reflector tub 15 of a component housing that serves to form the beam. As in the example of embodiment according to FIG. 1A, the semiconductor body 1 is surrounded by a shell 5 that contains the first wavelength conversion substance 10. The component according to FIG. 5, differently from the examples of embodiment described so far, also comprises a second selectively reflecting layer 16 that follows the first wavelength conversion substance 6 in the direction of emission of the semiconductor body 1 and reflects back into the shell 5 containing the first wavelength conversion substance 6 a definite fraction of the radiation of the first wavelength emitted by the semiconductor body 1, and that is transparent to converted radiation of the second wavelength. Like the first selectively reflecting layer 8, the second selectively reflecting layer 16, for example, is also made up of dielectric layers with alternating high and low refractive indices. Following this in the direction of emission of the semiconductor body 1, matrix material 7 of the shell 5 is also applied to the second selectively reflecting layer 16.

Figure 6:
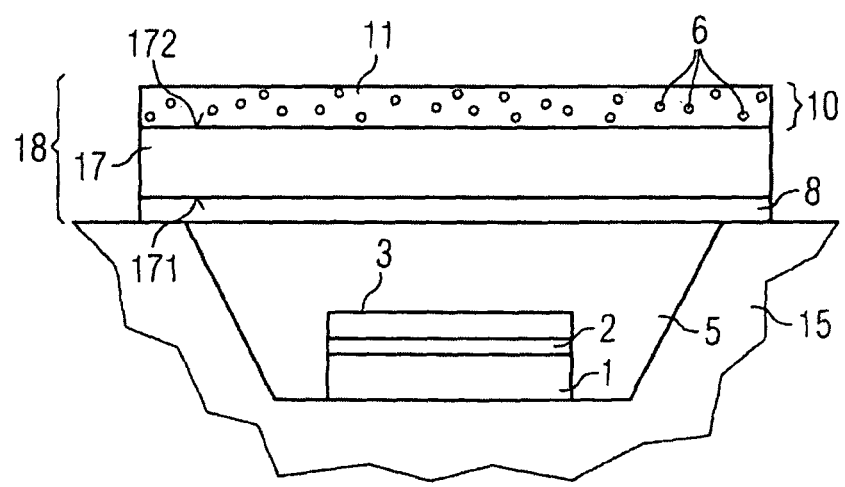

The semiconductor body 1 in the optoelectronic component according to the sixth example of embodiment illustrated in FIG. 6 is also mounted in a reflector tub 15 of a component housing and is contacted electrically with a bond wire (not shown) on its front face 3. The recess formed by the reflector tub 15 is filled with a casting compound 5 that envelops the semiconductor body. However, the shell 5 in this case contains no wavelength conversion substance. Alternatively, the shell 5 can be entirely omitted.

Instead, the component comprises a covering element 18 that has a carrier substrate 17, for example a glass substrate. The glass substrate, for example has a thickness between 10 and 300 µm inclusive. In this case, it has a thickness of about 100 µm. Alternatively, the carrier substrate 17 can also be a film, for example a nitrocellulose membrane. The film preferably has a thickness between 0.5 µm and 10 µm, and with special preference between 1 µm and 5 µm inclusive. For example, the thickness of the film is about 2 µm.

The first selectively reflecting layer 8 is located on the principal surface 171 of the glass substrate 17 facing the semiconductor body 1, in this case parallel to the front face 3 of the semiconductor body 1. The first wavelength conversion layer 10 is located on the principal surface 172 of the glass substrate 17 facing away from the semiconductor body 1, in this case likewise parallel to the front face 3 of the semiconductor body 1.

The covering element 18 is connected with mechanical stability, for example cemented, to the component housing, in particular to an edge of the reflector tub 15 and/or to the shell 5.

Another additional smoothly or diffusely reflecting layer can be developed beside the semiconductor body on the bottom surface and/or the lateral surfaces of the recess, which reflects the radiation emitted by the semiconductor body to the front face of the component, particularly toward the covering element.

The first and second wavelength conversion substances 6, 12 are preferably chosen from the group comprising the following substances: garnets doped with rare earth metals, alkaline earth sulfides doped with rare earth metals, thiogallates doped with rare earth metals, aluminates doped with rare earth metals, orthosilicates doped with rare earth metals, chlorosilicates doped with rare earth metals, alkaline earth silicon nitrides doped with rare earth metals, oxynitrides doped with rare earth metals, and aluminum oxynitrides doped with rare earth metals.

Suitable matrix materials for the shell 5, the first wavelength conversion layer 10, and the second wavelength conversion layer 14 are preferably transparent curable polymeric materials such as epoxides, acrylates, polyesters, polyamides, polyimides, polyurethanes, polyvinyl chloride, silicones, polymers containing polysiloxane, or mixtures of these materials.

The invention is not limited by the description with reference to the examples of embodiment. Instead, the invention comprises any new feature and any combination of features, which particularly includes any combination of features in the patent claims, even if this feature or this combination is not explicitly specified in the patent claims or the examples of embodiment.

The invention claimed is:

1. An optoelectronic component with:
   a semiconductor body that comprises an active semiconductor layer sequence that is suitable for generating electromagnetic radiation of a first wavelength, which is emitted from a front face of the semiconductor body,
   a first wavelength conversion substance, located in a first region following the semiconductor body in its direction of emission, which converts radiation of the first wavelength into radiation of a second wavelength different from the first wavelength,
   a second wavelength conversion substance, located in a second region that is spatially separated from the first region and that is between the active semiconductor layer sequence and a portion of the first region, that converts radiation of the first wavelength into radiation of a third wavelength different from the first and second wavelengths wherein the second wavelength is shorter than the third wavelength, and
   a first selectively reflecting layer between the active semiconductor layer sequence and the first wavelength conversion substance, which selectively reflects the radiation of the second wavelength and is transparent to radiation of the first wavelength.

2. The optoelectronic component of claim 1, in which the first selectively reflecting layer adjoins the radiation-emitting front face of the semiconductor body.

3. The optoelectronic component of claim 1, in which the first selectively reflecting layer covers a principal surface of the semiconductor body facing the radiation-emitting front face and/or the flanks of the semiconductor body.

4. The optoelectronic component of claim 1, in which the first selectively reflecting layer is monolithically integrated in the radiation-emitting front face of the semiconductor body.

5. The optoelectronic component of claim 1, in which the first selectively reflecting layer is spaced away from the semiconductor body.

6. The optoelectronic component of claim 1, in which the first selectively reflecting layer is also developed beside the semiconductor body.

7. The optoelectronic component of claim 1, in which another reflecting layer is developed beside the semiconductor body.

8. The optoelectronic component of claim 7, in which the other reflecting layer is a metal layer.

9. The optoelectronic component of claim 1 that emits mixed radiation that comprises radiation of the first wavelength and radiation of the second wavelength.

10. The optoelectronic component of claim 1, in which the first wavelength originates from the blue spectral region and the second wavelength originates from the yellow spectral region.

11. The optoelectronic component of claim 1, in which the first wavelength originates from the ultraviolet spectral region and the second and third wavelengths originate from the visible spectral region, and the component emits mixed radiation that comprises radiation of the second and third wavelengths.

12. The optoelectronic component of claim 1, in which the first, second, and third wavelengths originate from the visible spectral region and the component emits mixed radiation that comprises radiation of the first, second, and third wavelengths.

13. The optoelectronic component of claim 12, in which the first wavelength originates from the blue spectral region, the second wavelength originates from the red spectral region, and the third wavelength originates from the green spectral region.

14. The optoelectronic component of claim 1, in which the first selectively reflecting layer selectively reflects radiation of the second and third wavelengths and is transparent to radiation of the first wavelength.

15. The optoelectronic component of claim 9, in which the mixed radiation has a color point in the white region.

16. The optoelectronic component of claim 1, in which the semiconductor body is provided with a shell transparent to the radiation of the component.

17. The optoelectronic component of claim 16, in which the shell contains the first and/or the second wavelength conversion substance(s).

18. The optoelectronic component of claim 17, in which the shell comprises a matrix material and particles of the first and/or the second wavelength conversion substance(s), which are embedded in the matrix material of the shell.

19. The optoelectronic component of claim 1, in which the first wavelength conversion substance is contained in a first wavelength conversion layer.

20. The optoelectronic component of claim 1, in which the second wavelength conversion substance is contained in the first wavelength conversion layer or in a second wavelength conversion layer.

21. The optoelectronic component of claim 19, in which the first or the second wavelength conversion layer is located adjoining the semiconductor body.

22. The optoelectronic component claim 19, in which the first or the first and the second wavelength conversion layer(s) is/are spaced away from the semiconductor body.

23. The optoelectronic component pursuant to of claim 22, with a covering element that comprises the first and/or the second wavelength conversion layer(s) and/or the first selectively reflecting layer.

24. The optoelectronic component of claim 23, in which the covering element comprises a carrier substrate.

25. The optoelectronic component of claim 24, in which the carrier substrate contains glass.

26. The optoelectronic component of claim 24, in which the carrier substrate is a film.

27. The optoelectronic component of claim 19, in which the first and/or the second wavelength conversion layer(s) has/have a constant thickness.

28. The optoelectronic component of claim 19, in which the first and/or the second wavelength conversion layer(s) has/have a matrix material and the first and/or the second wavelength conversion substance(s) has/have particles that are embedded in the matrix material of the first/second wavelength conversion layers.

29. The optoelectronic component of claim 18, in which the particles of the first and/or the second wavelength conversion substance(s) are distributed essentially homogeneously in the matrix material of the shell or in the matrix material of the first and/or the second wavelength conversion layer(s).

30. An optoelectronic component with:
a semiconductor body that comprises an active semiconductor layer sequence that is suitable for generating electromagnetic radiation of a first wavelength, which is emitted from a front face of the semiconductor body;
a first wavelength conversion substance following the semiconductor body in its direction of emission, which converts radiation of the first wavelength into radiation of a second wavelength different from the first wavelength;
a second wavelength conversion substance that converts radiation of the first wavelength into radiation of a third wavelength different from the first and second wavelengths; and
a first selectively reflecting layer between the active semiconductor layer sequence and the first wavelength conversion substance, which selectively reflects the radiation of the second wavelength and is transparent to radiation of the first wavelength,
in which the first and the second wavelength conversion substances are located in two regions spatially separated from one another; and
in which the region that contains the first wavelength conversion substance and the region that contains the second wavelength conversion substance follow the radiation-emitting front face of the semiconductor body in the direction of emission of the semiconductor body so that the wavelength into which the radiation of the first wavelength is converted by the particular wavelength conversion substance in each case is shorter, viewed from the semiconductor body in its direction of emission, than the wavelength into which the wavelength conversion substance that precedes it relative to the direction of emission of the semiconductor body converts the first wavelength.

31. The optoelectronic component of claim 1, in which a second selectively reflecting layer follows the first wavelength conversion substance and optionally the second wavelength conversion substance in the direction of emission of the semiconductor body, which selectively reflects a given fraction of the radiation of the first wavelength and is transparent to another fraction of the radiation of the first wavelength and to radiation of the second wavelength, and optionally to radiation of the third wavelength.

32. The optoelectronic component of claim 1, in which a large fraction of the electromagnetic radiation emitted by the active semiconductor layer sequence in operation is emitted perpendicular to the principal dimensional plane of the active semiconductor layer sequence.

33. The optoelectronic component of claim 32, in which the semiconductor body is a thin-film LED chip.

34. The optoelectronic component of claim 1, in which the first selectively reflecting layer (8) and/or the second selectively reflecting layer (16) has/have a layer sequence with dielectric layers that have alternately high and low refractive indices.

35. The optoelectronic component of claim 34, in which the first selectively reflecting layer has high transmissivity for electromagnetic radiation with a wavelength smaller than a limiting wavelength $\lambda_G$ and high reflectivity for electromagnetic radiation with a wavelength greater than the limiting wavelength $\lambda_G$.

36. The optoelectronic component of claim 35, in which the limiting wavelength $\lambda_G$ changes with the angle of incidence of the electromagnetic radiation on the first selectively reflecting layer.

37. The optoelectronic component of claim 36, in which the limiting wavelength $\lambda_G$ decreases with increasing angle of incidence of the electromagnetic radiation on the first selectively reflecting layer.

38. The optoelectronic component of claim 37, in which the limiting wavelength $\lambda_G$ for electromagnetic radiation that strikes the first selectively reflecting layer at an angle of incidence of 45° is 20 nm or more smaller than the limiting wavelength $\lambda_G$ for electromagnetic radiation that strikes the first selectively reflecting layer perpendicularly.

39. The optoelectronic component of claim 36, in which
electromagnetic radiation of the first wavelength that is emitted in operation by the active semiconductor layer sequence perpendicular to the principal dimensional plane of the active layer sequence toward the front face of the semiconductor body is transmitted by the first selectively reflecting layer, and
electromagnetic radiation of the first wavelength that strikes the first selectively reflecting layer at an angle is reflected by it.

* * * * *

UNITED STATES PATENT AND TRADEMARK OFFICE
CERTIFICATE OF CORRECTION

| | | |
|---|---|---|
| PATENT NO. | : 8,598,604 B2 | Page 1 of 1 |
| APPLICATION NO. | : 12/088250 | |
| DATED | : December 3, 2013 | |
| INVENTOR(S) | : Dominik Eisert et al. | |

It is certified that error appears in the above-identified patent and that said Letters Patent is hereby corrected as shown below:

In the Claims:

Column 17
Line 49, In claim 22, delete "component" and insert -- component of --

Signed and Sealed this
Fifteenth Day of April, 2014

Michelle K. Lee
*Deputy Director of the United States Patent and Trademark Office*